(12) United States Patent
Haziza (10) Patent No.: US 10,505,280 B2
(45) Date of Patent: Dec. 10, 2019

(54) MULTI-LAYERED SOFTWARE DEFINED ANTENNA AND METHOD OF MANUFACTURE

(71) Applicant: Wafer LLC, Hanover, NH (US)

(72) Inventor: Dedi David Haziza, Kiryat Motzkin (IL)

(73) Assignee: WAFER LLC, Hanover, NH (US)

(*) Notice: Subject to any disclaimer, the term of this patent is extended or adjusted under 35 U.S.C. 154(b) by 0 days.

(21) Appl. No.: 16/438,303

(22) Filed: Jun. 11, 2019

(65) Prior Publication Data

US 2019/0296440 A1 Sep. 26, 2019

Related U.S. Application Data

(62) Division of application No. 15/654,643, filed on Jul. 19, 2017, now Pat. No. 10,326,205.

(Continued)

(51) Int. Cl.

| | |
|---|---|
| *H01Q 3/36* | (2006.01) |
| *H01Q 9/04* | (2006.01) |
| *H04B 7/08* | (2006.01) |
| *H04L 27/18* | (2006.01) |
| *H04B 7/0413* | (2017.01) |
| *H01Q 21/28* | (2006.01) |
| *H01Q 21/24* | (2006.01) |
| *H01Q 21/06* | (2006.01) |
| *H01Q 9/14* | (2006.01) |
| *H01Q 3/24* | (2006.01) |
| *H01Q 1/50* | (2006.01) |
| *H01Q 1/48* | (2006.01) |
| *H01L 23/66* | (2006.01) |

(52) U.S. Cl.
CPC .......... *H01Q 9/0457* (2013.01); *H01L 23/66* (2013.01); *H01Q 1/48* (2013.01); *H01Q 1/50* (2013.01); *H01Q 3/24* (2013.01); *H01Q 3/36* (2013.01); *H01Q 9/0414* (2013.01); *H01Q 9/0442* (2013.01); *H01Q 9/145* (2013.01); *H01Q 21/065* (2013.01); *H01Q 21/24* (2013.01); *H01Q 21/245* (2013.01); *H01Q 21/28* (2013.01); *H04B 7/0413* (2013.01); *H04B 7/08* (2013.01); *H04L 27/18* (2013.01)

(58) Field of Classification Search
CPC .. H01Q 9/04; H01Q 1/48; H01Q 1/50; H01Q 3/24; H01Q 3/36; H01Q 9/14; H01Q 21/06; H01Q 21/24; H01Q 21/28
USPC ........................................................ 343/743
See application file for complete search history.

(56) References Cited

U.S. PATENT DOCUMENTS

| | | | |
|---|---|---|---|
| 2008/0036664 A1* | 2/2008 | Haziza | ..................... H01Q 3/36 343/700 MS |
| 2012/0105305 A1* | 5/2012 | Maruyama | ............... H01Q 3/46 343/912 |

* cited by examiner

*Primary Examiner* — Andrea Lindgren Baltzell
(74) *Attorney, Agent, or Firm* — Womble Bond Dickinson (US) LLP; Joseph Bach, Esq.

(57) ABSTRACT

A multi-layer software controlled antenna. A radiating patch is provided over a variable dielectric constant (VDC) plate. Variable DC potential is applied across the VDC plate to control the effective dielectric constant at various locations of the VDC plate. RF signal is coupled between a feed patch and a delay line, and the delay line couples the RF signal to the radiating patch. The radiating patch, VDC plate, delay line, and feed patch are each provided at a different layer of the antenna, so as to decouple the RF and DC signal paths. A controller executes a software program to thereby control the variable DC potential applied across the VDC plate, (Continued)

thereby controlling the operational characteristics of the antenna.

20 Claims, 11 Drawing Sheets

Related U.S. Application Data

(60) Provisional application No. 62/431,393, filed on Dec. 7, 2016, provisional application No. 62/382,489, filed on Sep. 1, 2016, provisional application No. 62/382,506, filed on Sep. 1, 2016.

MULTI-LAYERED SOFTWARE DEFINED ANTENNA AND METHOD OF MANUFACTURE

RELATED APPLICATIONS

This Application is a divisional of U.S. patent application Ser. No. 15/654,643, filed on Jul. 19, 2017 (now U.S. Pat. No. 10,326,205), which claims priority benefit from U.S. Provisional Application No. 62/431,393, filed on Dec. 7, 2016, U.S. Provisional Application No. 62/382,489, filed on Sep. 1, 2016, and U.S. Provisional Application No. 62/382,506, filed on Sep. 1, 2016, and is also related to U.S. patent application Ser. No. 15/421,388, filed on Jan. 31, 2017, the disclosures of all of which are incorporated herein by reference in their entireties.

BACKGROUND

1. Field

The disclosed invention relates to radio-transmission and/or reception antennas and methods for manufacturing such antennas and its associated feeding networks, be it microstrip, stripline or other.

2. Related Art

In a prior disclosure, the subject inventor has disclosed an antenna that utilizes variable dielectric constant to control the characteristics of the antenna, thereby forming a software defined antenna. Details about that antenna can be found in U.S. Pat. No. 7,466,269, the entire disclosure of which is incorporated herein by reference. The antenna disclosed in the '269 patent proved to be operational and easy to manufactured by simply forming the radiating elements and feeding lines on top of an LCD screen. Therefore, further research has been done to further investigate different possibilities of fabricating software defined antennas, as disclosed herein.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

This disclosure provides various enhancements and advancement for the variable dielectric constant antenna. Embodiments disclosed herein provide an improved antenna array and method for manufacturing such an antenna array.

Various disclosed embodiments provide an antenna having capacitively coupled feed line and other means to connect the feeding network to the radiating elements, such as vias and proximity coupling. The antenna comprises an insulating substrate; a conductive patch provided on top surface of the insulating substrate; a ground plane provided on bottom surface of the insulating substrate, the ground plane comprising an aperture therein, the aperture being registered to be aligned below the conductive patch; a feed line having terminative end thereof registered to be aligned below the aperture, so as to capacitively transmit RF signal to the conductive patch through the aperture. Other configurations are feasible as well and the following example is set to provide an optional solution and provide an insight on how to implement the system most effectively.

Embodiments of the invention provide a software defined antenna by using a variable dielectric to control a delay line, thereby generating a phase and/or frequency shift. The phase shift may be used, e.g., for spatial orientation of the antenna or for polarization control. Disclosed embodiments decouple the antenna and the corporate feed design so as to avoid signal interference between them. Disclosed embodiments further decouple the RF and DC potentials. The various elements of the antenna, such as the radiator, the corporate feed, the variable dielectric, the phase shift control lines, etc., are provided in different layers of a multi-layered antenna design, thus decoupling the design and avoiding cross-talk.

Various disclosed features include a novel arrangement for coupling the RF signal between the radiating element and the feed line; an arrangement for controlling frequency and phase of the signal; a multi-layered antenna; and methods of manufacturing the antenna.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 3A illustrates a top view of a single radiating element, while FIG. 3B illustrates a cross section of relevant sections of the antenna at the location of the radiating element of FIG. 3A, according to one embodiment;

FIG. 6A illustrates a top view of a single radiating element, while FIG. 6B illustrates a cross section of relevant sections of the antenna at the location of the radiating element of FIG. 6A, according to an embodiment having two delay lines connected to each patch, similar to what is shown in FIG. 2; while FIGS. 6C and 6D describe embodiments that have the variable dielectric layer directly beneath the RF line and that the RF line is activated by an AC voltage through a BiasT, that is to provide a strong impact line as well as two layers for two different corporate feeding networks. FIG. 6E illustrates a rectangular patch that can be used to operate in two different frequencies, while FIG. 6F illustrates a standard Bias-T circuit.

FIG. 8 illustrates an embodiment with two delay lines connected to a single patch, such that each delay line may carry a different polarization; while

FIG. 9 illustrates an embodiment wherein the VDC plate includes only defined area of VDC material; while

DETAILED DESCRIPTION

Embodiments of the inventive antenna will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Figure 1:
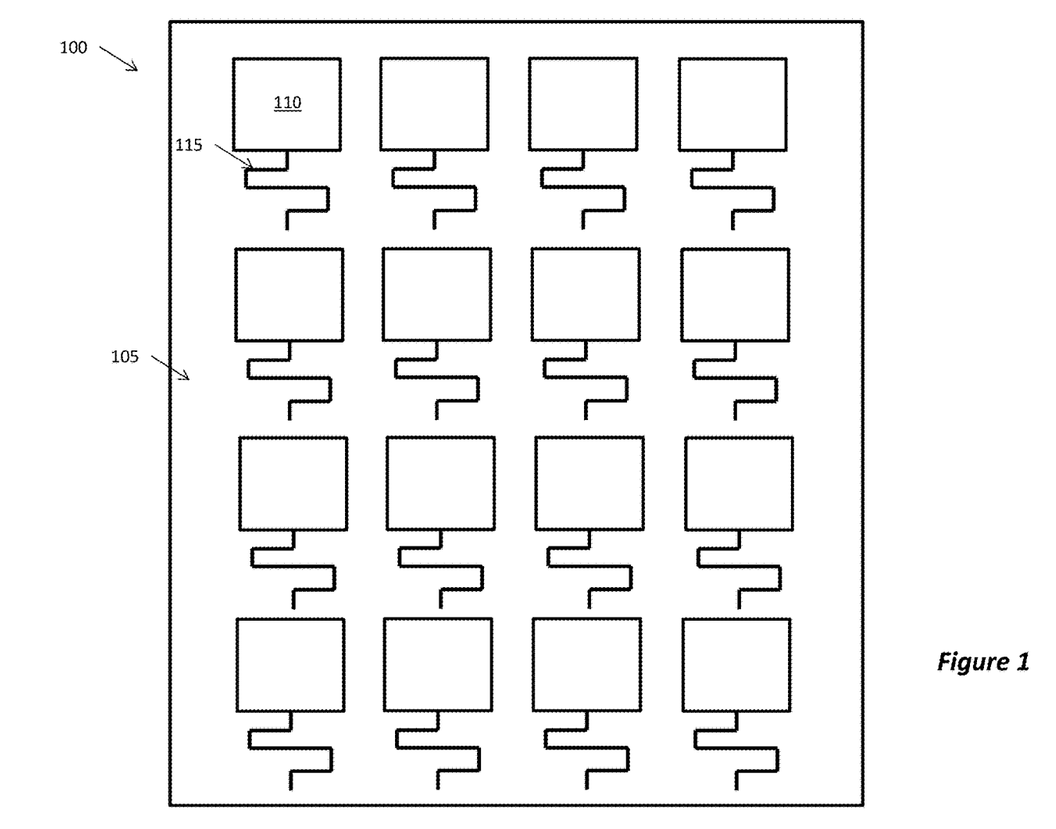
FIG. 1 illustrates a top view of an antenna according to one embodiment.

FIG. 1 illustrates a top view of an antenna 100, according to one embodiment. Generally, the antenna is a multi-layer antenna that includes the patch layers, the true time delay layer, the slotted ground layer and the corporate feed layer, as will be described in more details below. In some instances, additional layers are added, providing multiple polarization, wider bandwidth, etc. The various elements of the antenna may be printed or deposited on the insulating substrates.

As illustrated in FIG. 1, the antenna in this particular example comprises a 4×4 array of radiators 110, although any number of radiators in various geometries and arrangements may be used, and a square arrangement of 4×4 elements is chosen only as one example. In this example each radiator 110 is a conductive patch provided (e.g., deposited, adhered to, or printed) on top of an insulation layer 105 and has a delay feed line 115 coupled to it, either physically or capacitively, as will be explained further below. Each delay feed line 115 is a conductor that provides the RF signal to its corresponding patch 110. The RF signal can be manipulated, e.g., delayed, change frequency, change phase, by controlling a variable dielectric layer positioned under the delay line. By controlling all of the delay lines, the array can be made to point to different directions, as needed, thus providing a scanning array.

Figure 2:
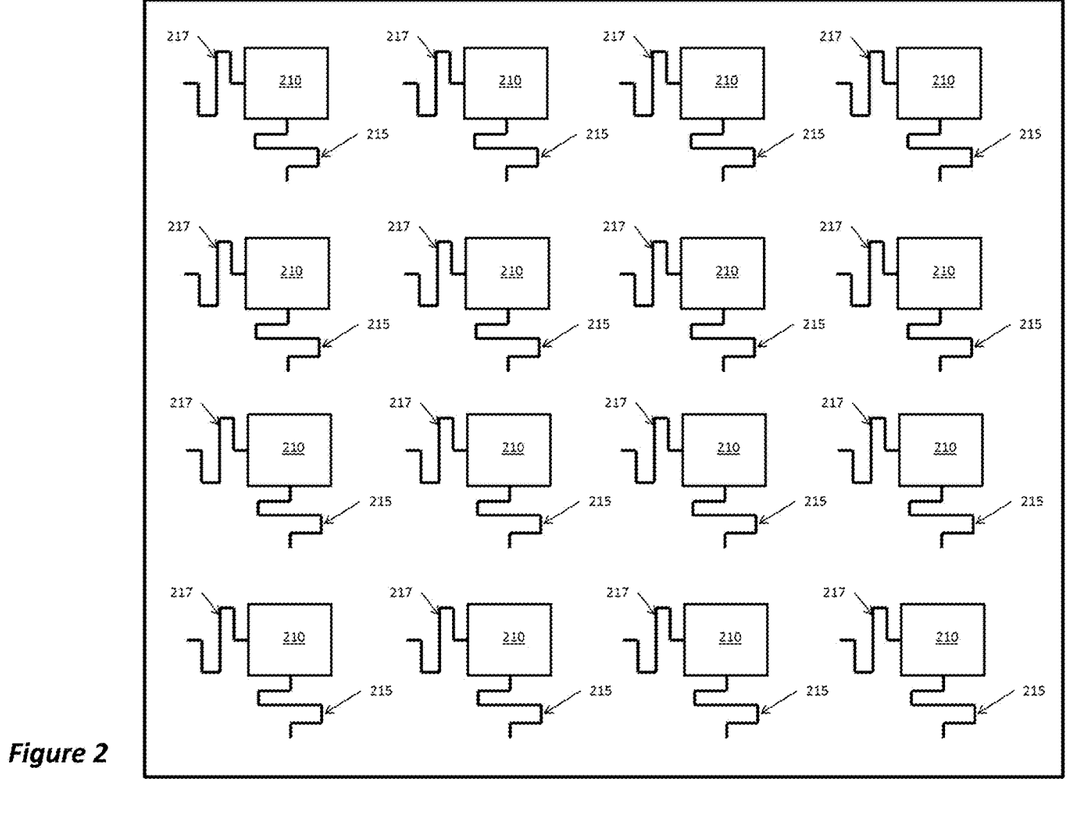
FIG. 2 illustrates a top view of an antenna according to another embodiment, wherein each radiating element can be fed by two orthogonal feed lines.

In FIG. 1 each element is fed from only one feed line. However, as illustrated in FIG. 2, each radiating element 210 can be fed by two orthogonal feed lines, 215 and 217, for example, each having different polarization. The description provided herein is applicable to both and any similar, architectures.

Figures 3A, 3B:
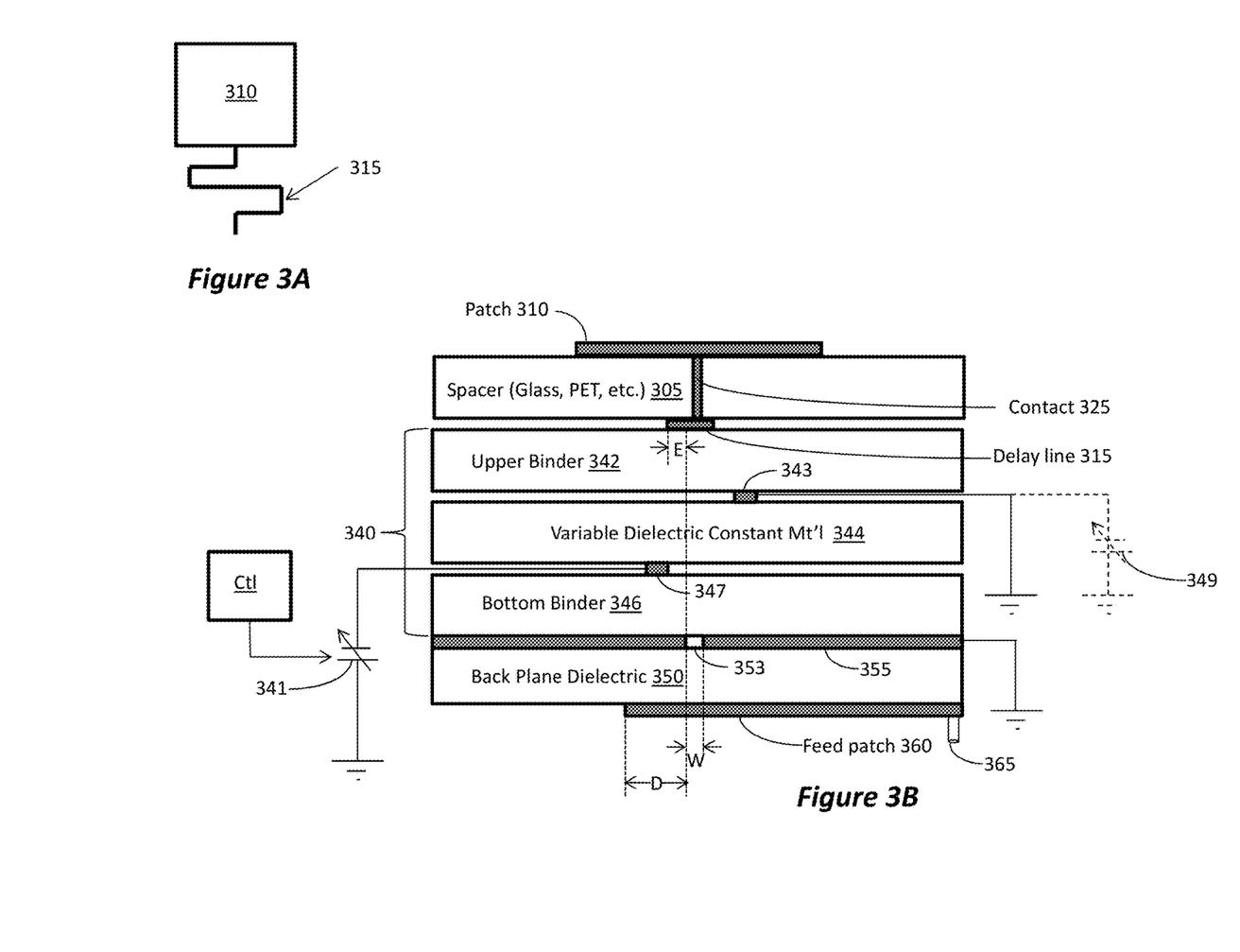
Figure 8:
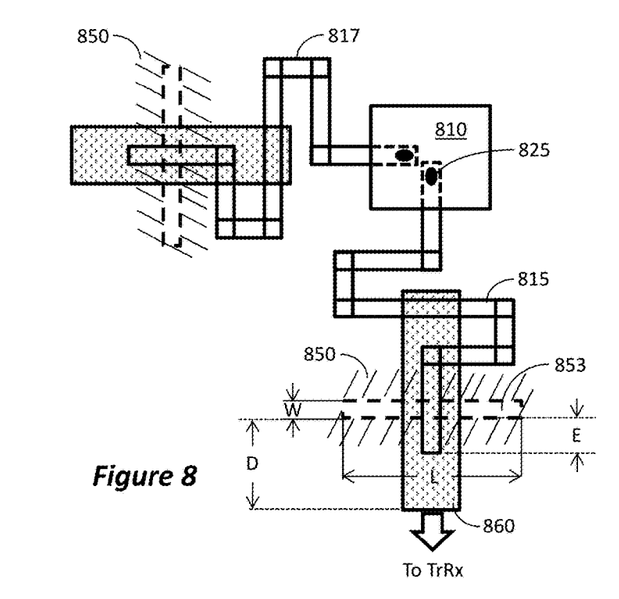

The structure and operation of the antennas shown in FIGS. 1 and 2 can be better understood from the following description of FIGS. 3A and 3B, with further reference to FIG. 8. FIG. 3A illustrates a top view of a single radiating element 310, while FIG. 3B illustrates a cross section of relevant sections of the antenna at the location of the radiating element 310 of FIG. 3A. FIG. 8 provides a top "transparent" view that is applicable to all of the embodiments described herein, including the embodiment of FIGS. 3A and 3B. Thus, in studying any of the embodiments disclosed herein, the reader should also refer to FIG. 8 for a better understanding.

A top dielectric spacer 305 is generally in the form of a dielectric (insulating) plate or a dielectric sheet, and may be made of, e.g., glass, PET, etc. The radiating patch 310 is formed over the spacer by, e.g., adhering a conductive film, sputtering, printing, etc. At each patch location, a via is formed in the dielectric spacer 305 and is filled with conductive material, e.g., copper, to form contact 325, which connects physically and electrically to radiating patch 310. A delay line 315 is formed on the bottom surface of dielectric spacer 305 (or on top surface of upper binder 342), and is connected physically and electrically to contact 325. That is, there is a continuous DC electrical connection from the delay line 315 to radiating patch 310, through contact 325. As shown in FIG. 3A, the delay line 315 is a meandering conductive line and may take on any shape so as to have sufficient length to generate the desired delay, thereby causing the desired phase shift in the RF signal.

The delay in the delay line 315 is controlled by the variable dielectric constant (VDC) plate 340 having variable dielectric constant material 344. While any manner for constructing the VDC plate 340 may be suitable for use with the embodiments of the antenna, as a shorthand in the specific embodiments the VDC plate 340 is shown consisting of upper binder 342, (e.g., glass PET, etc.) variable dielectric constant material 344 (e.g., twisted nematic liquid crystal layer), and bottom binder 346. In other embodiments one or both of the binder layers 342 and 344 may be omitted. Alternatively, adhesive such as epoxy or glass beads may be used instead of the binder layers 342 and/or 344.

In some embodiments, e.g., when using twisted nematic liquid crystal layer, the VDC plate 340 also includes an alignment layer that may be deposited and/or glued onto the bottom of spacer 305, or be formed on the upper binder 342. The alignment layer may be a thin layer of material, such as polyimide-based PVA, that is being rubbed or cured with UV in order to align the molecules of the LC at the edges of confining substrates.

The effective dielectric constant of VDC plate 340 can be controlled by applying DC potential across the VDC plate 340. For that purpose, electrodes are formed and are connected to controllable voltage potential. There are various arrangements to form the electrodes, and several examples will be shown in the disclosed embodiments. In the arrangement shown in FIG. 3B, two electrodes 343 and 347 and provided—one on the bottom surface of the upper binder 342 and one on the upper surface of the bottom binder 346. As one example, electrode 347 is shown connected to variable voltage potential 341, while electrode 343 is connected to ground. As one alternative, shown in broken line, electrode 343 may also be connected to a variable potential 349. Thus, by changing the output voltage of variable potential 341 and/or variable potential 349, one can change the dielectric constant of the VDC material in the vicinity of the electrodes 343 and 347, and thereby change the RF signal traveling over delay line 315. Changing the output voltage of variable potential 341 and/or variable potential 349 can be done using a controller, Ctl, running software that causes the controller to output the appropriate control signal to set the appropriate output voltage of variable potential 341 and/or variable potential 349. Thus, the antenna's performance and characteristics can be controlled using software—hence software controlled antenna.

At this point it should be clarified that in the subject description the use of the term ground refers to both the generally acceptable ground potential, i.e., earth potential, and also to a common or reference potential, which may be a set potential or a floating potential. Similarly, while in the drawings the symbol for ground is used, it is used as shorthand to signify either an earth or a common potential, interchangeably. Thus, whenever the term ground is used herein, the term common or reference potential, which may be set or floating potential, is included therein.

As with all RF antennas, reception and transmission are symmetrical, such that a description of one equally applies to the other. In this description it may be easier to explain transmission, but reception would be the same, just in the opposite direction.

In transmission mode the RF signal is applied to the feed patch 360 via connector 365 (e.g., a coaxial cable connector). As shown in FIG. 3B, there is no electrical DC connection between the feed patch 360 and the delay line 315. However, in disclosed embodiments the layers are designed such that an RF short is provided between the feed patch 360 and delay line 315. As illustrated in FIG. 3B, a back plane conductive ground (or common) 355 is formed on the top surface of back plane insulator (or dielectric) 350 or the bottom surface of bottom binder 346. The back plane conductive ground 355 is generally a layer of conductor covering the entire area of the antenna array. At each RF feed location a window (DC break) 353 is provided in the back plane conductive ground 355. The RF signal travels from the feed patch 360, via the window 353, and is coupled to the delay line 315. The reverse happens during reception. Thus, a DC open and an RF short are formed between delay line 315 and feed patch 360.

In one example the back plane insulator 350 is made of a Rogers® (FR-4 printed circuit board) and the feed patch 360 may be a conductive line formed on the Rogers. Rather than using Rogers, a PTFE (Polytetrafluoroethylene or Teflon®) or other low loss material may be used.

To further understand the RF short (also referred to as virtual choke) design of the disclosed embodiments, reference is made to FIG. 8. One should note that similar elements in the drawings have the same references, except in a different series, e.g., in FIG. 8 the 8xx series is used. Also, FIG. 8 illustrates an embodiment with two delay lines connected to a single patch 810, such that each delay line may carry a different signal, e.g., at different polarization. The following explanation is made with respect to one of the delay lines, as the other may have similar construction.

In FIG. 8 the radiating patch 810 is electrically DC connected to the delay line 815 by contact 825 (the delay line for the other feed is referenced as 817). So, in this embodiment the RF signal is transmitted from the delay line 815 to the radiating patch 810 directly via the contact 825. However, no DC connection is made between the feed patch 860 and the delay line 815; rather, the RF signal is capacitively coupled between the feed patch 860 and the delay line 815. This is done through an aperture in the ground plane 850. As shown in FIG. 3B, the VDC plate 340 is positioned below the delay line 315, but in FIG. 8 it is not shown, so as to simplify the drawing for better understanding of the RF short feature. The back ground plane 850is partially represented by the hatch marks, also showing the window (DC break) 853. Thus, in the example of FIG. 8 the RF path is radiating patch 810, to contact 825, to delay line 815, capacitively through window 850 to feed patch 860.

For efficient coupling of the RF signal, the length of the window 853, indicated as "L", should be set to about half the wavelength of the RF signal traveling in the feed patch 860, i.e., $\lambda/2$. The width of the window, indicated as "W", should be set to about a tenth of the wavelength, i.e., $\lambda/10$. Additionally, for efficient coupling of the RF signal, the feed patch 860 extends about a quarter wave, $\lambda/4$, beyond the edge of the window 853, as indicated by D. Similarly, the terminus end (the end opposite contact 825) of delay line 815 extends a quarter wave, $\lambda/4$, beyond the edge of the window 853, as indicated by E. Note that distance D is shown longer than distance E, since the RF signal traveling in feed patch 860 has a longer wavelength than the signal traveling in delay line 815.

It should be noted that in the disclosure, every reference to wavelength, $\lambda$, indicates the wavelength traveling in the related medium, as the wavelength may change as it travels in the various media of the antenna according to its design and the DC potential applied to variable dielectric matter within the antenna.

Figure 8A:
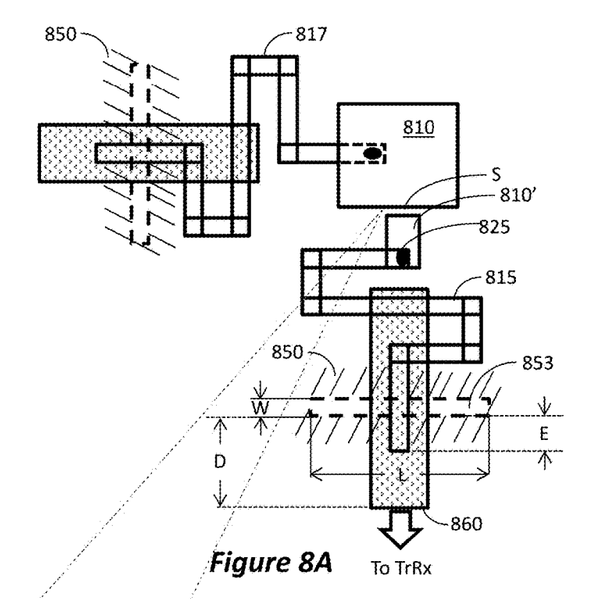
FIG. 8A illustrates a variation of the embodiment shown in FIG. 8.

As explained above, in the example of FIG. 8 the RF signal path between the delay line and the radiating patch is via a resistive, i.e., physical conductive contact. On the other hand, FIG. 8A illustrates a variation wherein the RF signal path between the delay line and the radiating patch is capacitive, i.e., there's no physical conductive contact between them. As shown in FIG. 8A and its callout, a coupling patch 810' is fabricated nest to the radiating patch 810. The contact 825 forms physical conductive contact between the delay line 815 and coupling patch 810'. The coupling of the RF signal between the radiating patch 810 and the coupling patch 810' is capacitive across the short dielectric space S. The space S may be simply air or filled with other dielectric material. While in FIG. 8A only delay line 815 is shown capacitively coupled to the radiating patch 810, this is done for illustration only, and it should be appreciated that both delay lines 815 and 817 may be capacitively coupled to the radiating patch 810.

Figure 4:
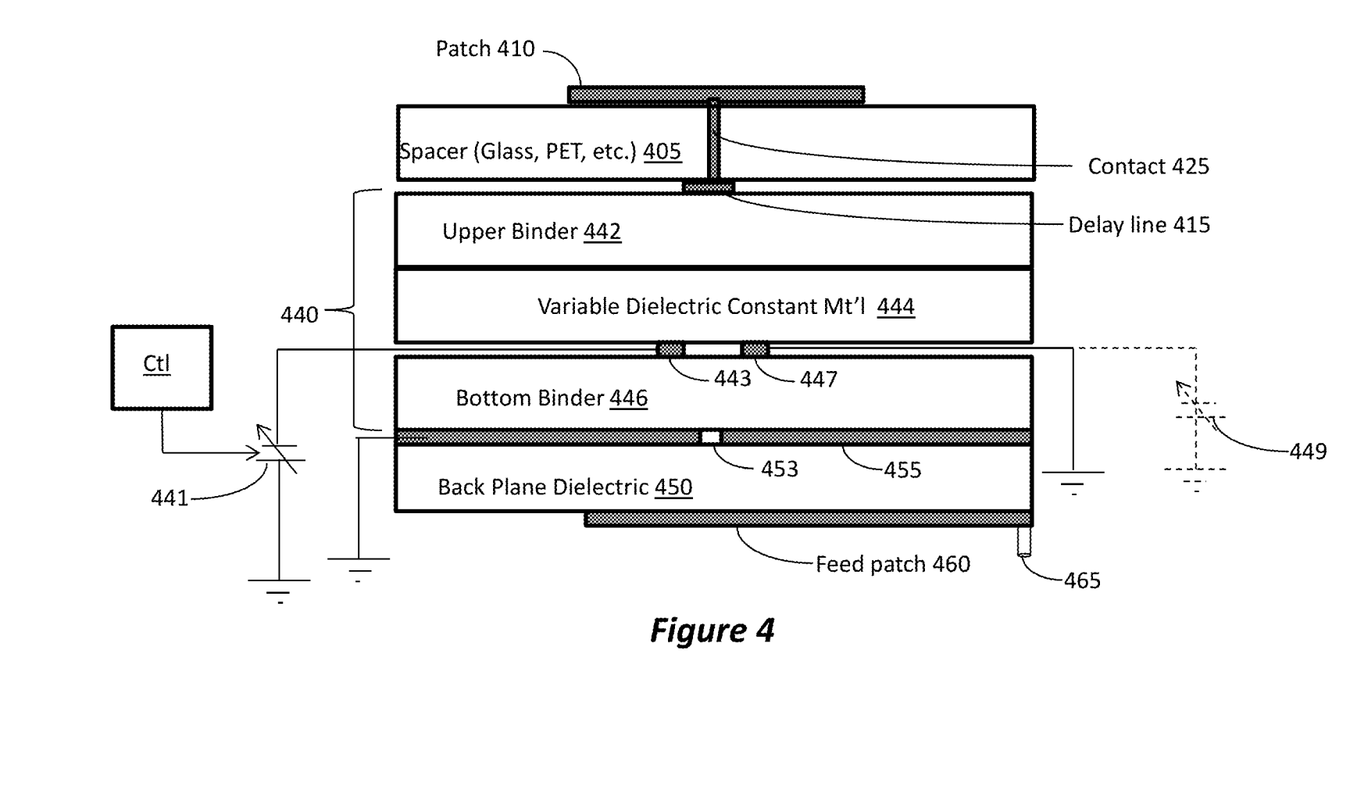
FIG. 4 illustrates a cross section of relevant sections of the antenna at the location of the radiating element according to another embodiment.

FIG. 4 illustrates another embodiment having similar construction to that of FIG. 3B, except for the arrangement for applying DC potential to the variable dielectric constant material 444. In FIG. 4, the two electrodes 443 and 447 are provided side by side, rather than across the layer 444. The electrodes 443 and 447 can be formed on the top surface of bottom binder 446. Otherwise the structure and operation of the antenna shown in FIG. 4 is similar to that shown in FIG. 3B.

Figure 5:
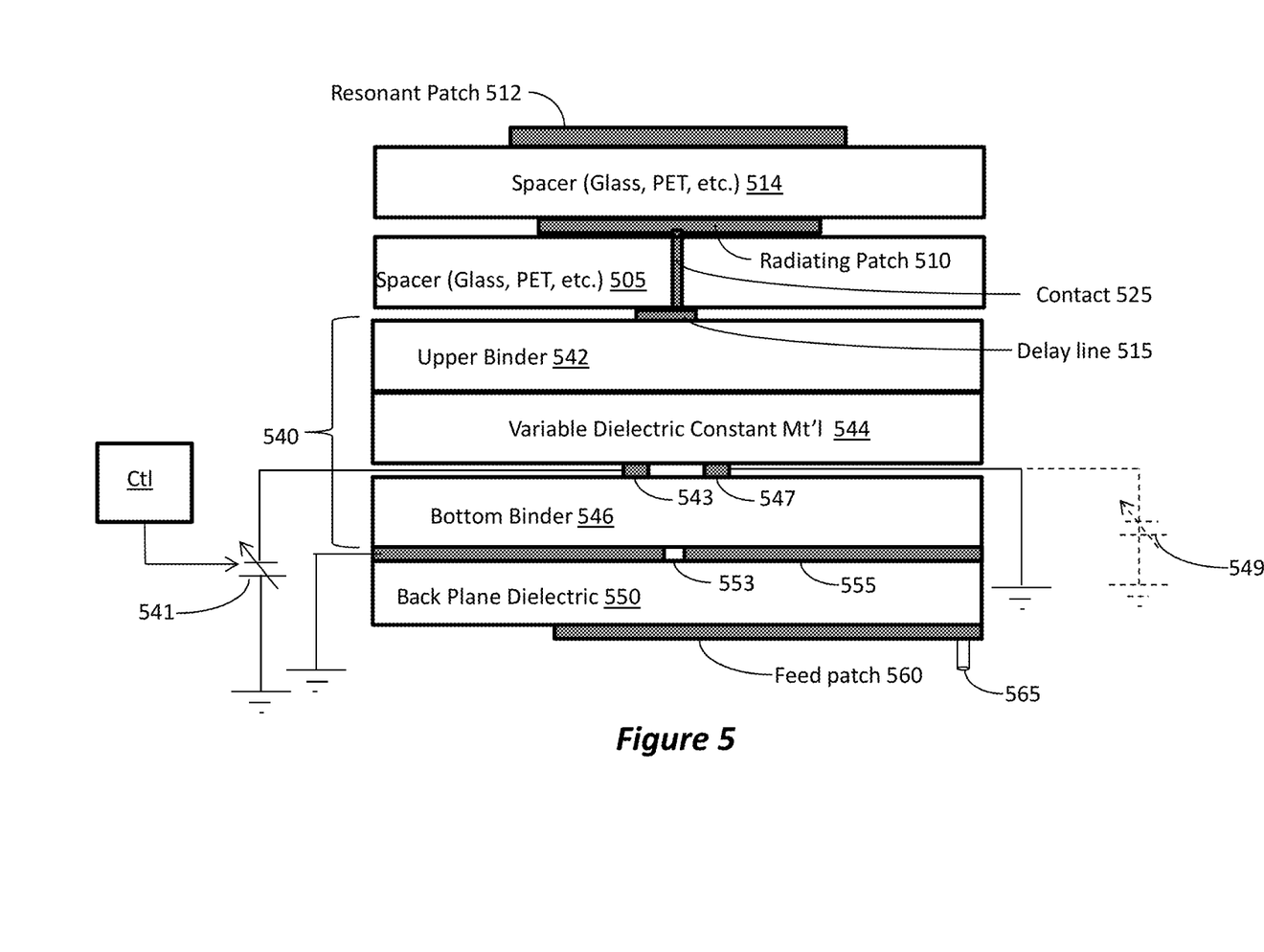
FIG. 5 illustrates a cross section of relevant sections of the antenna at the location of the radiating element according to another embodiment designed to provide enhanced bandwidth.

FIG. 5 illustrates another example designed to provide enhanced bandwidth. The general structure of the antenna of FIG. 5 can be according to any of the embodiments provided herein, except that another dielectric layer in the form of spacer 514 is provided over the radiating patch 510. A resonant path, 512, is formed on top of the spacer 514. Resonant patch 512 has the same shape as radiating patch 510, except that it is larger, i.e., has larger width and larger length, if it is a rectangle, or larger sides if it is a square. The RF signal is coupled between radiating patch 510 and resonant patch 512 capacitively across spacer 514. This arrangement provides a larger bandwidth than using just radiating patch 510.

Figures 6A, 6B:
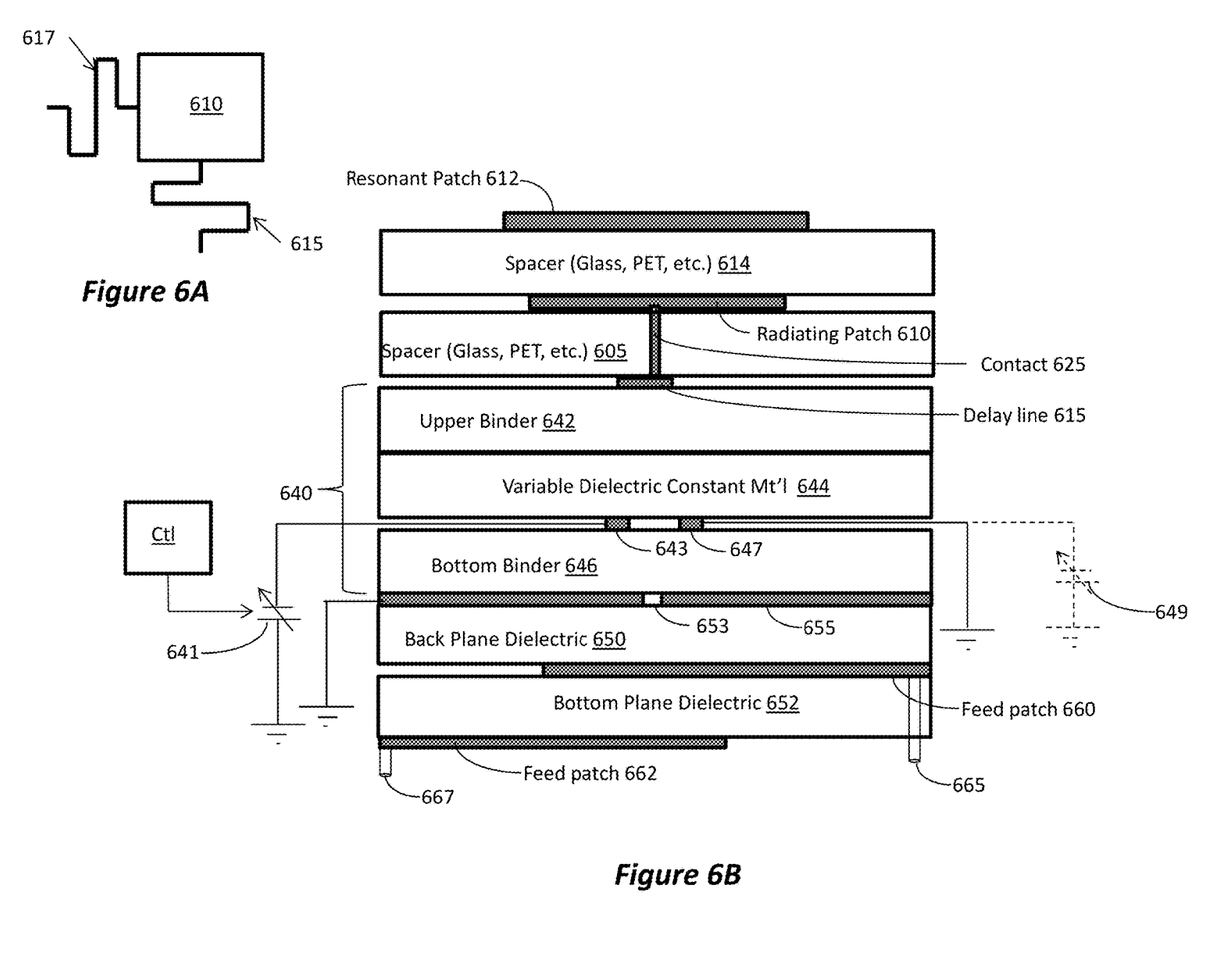

FIGS. 6A and 6B illustrate an embodiment having two delay lines connected to each patch, similar to what is shown in FIG. 2. In such an embodiment, each delay line may transmit in different polarization. A bottom dielectric 652 separates the two feed patches 660 and 662, each coupling signal to a respective one of the delay lines 615 and 617. The two feed patches 660 and 662 are oriented orthogonally to each other. The signal coupling is done capacitively through a window 653 in the conductive ground 655, as illustrated in the previous examples. In FIG. 6B only one window 653 is illustrated, since the other window is provided in another plane not shown in this cross section. However, the arrangement of two windows can be seen in FIG. 8.

Figure 6C:
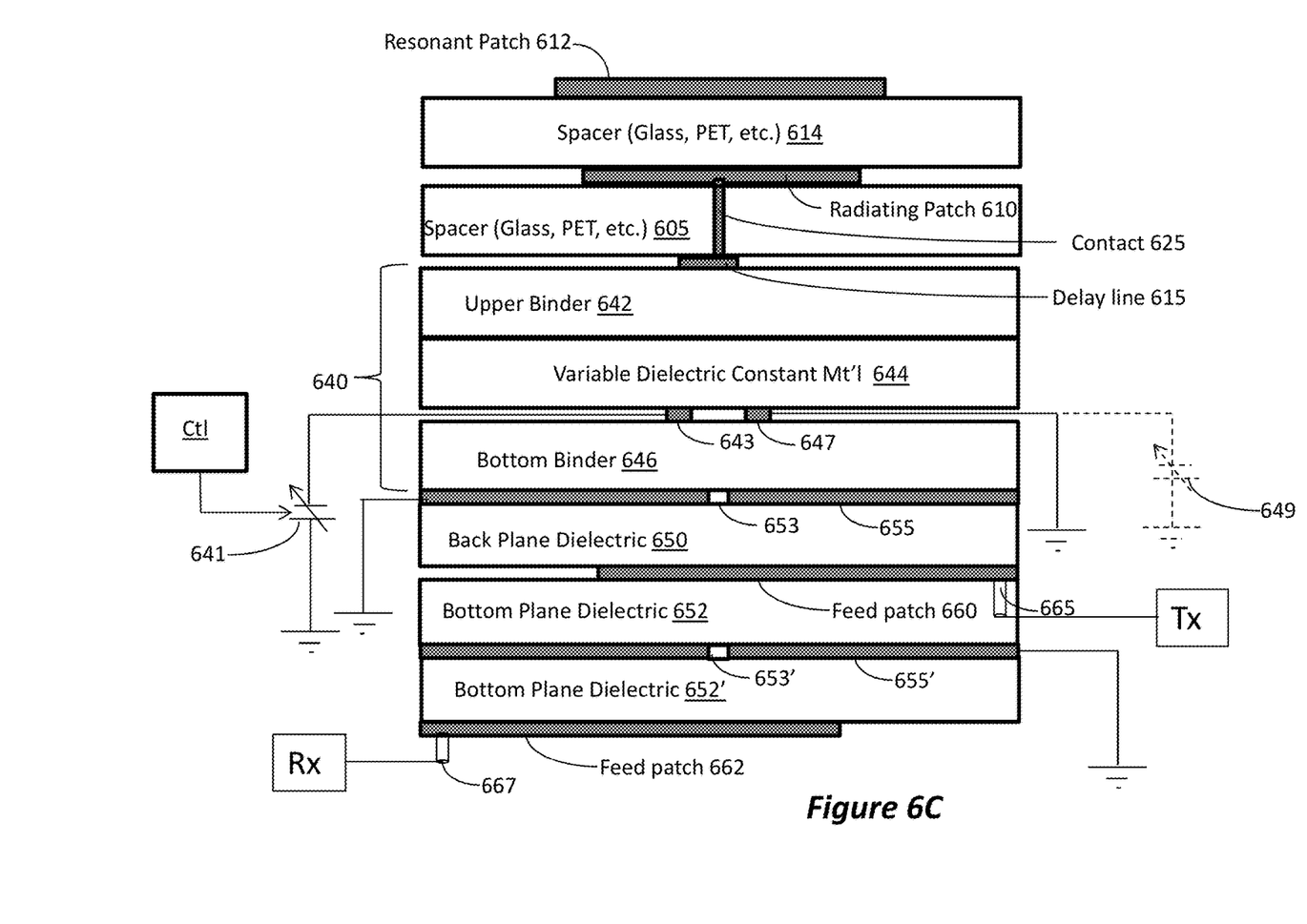

FIG. 6C illustrates another example of two orthogonal feed lines. In this particular example one feed line is used for transmission while the other is used for reception. While this embodiment is illustrated in conjunction with radiating patch 610 and resonant patch 612, this is not necessary and is used only for consistency of illustration with FIG. 6B. In the specific example of FIG. 6C feed patch 660 is provided on the bottom of back plane dielectric 650 and is coupled to a transmission line via connector 665. The signal from the transmission line 665 is coupled from feed patch 660 capacitively through the window 653 in conductive ground 655 to the radiating patch 610. A second conductive ground 655' with window 653' is provided on the bottom of bottom plane dielectric 652. A second bottom plane dielectric 652' is provided below the second conductive ground 655', and feed patch 662 is provided on the bottom of the second bottom plane dielectric 652'. In this example, feed patch dielectric 662 is used for reception. In one example radiating patch 610 is square, so that the transmission and reception are performed at the same frequency, but may be at different polarization and/or phase. According to another example, the radiating patch 610 is rectangle (see FIG. 6E), in which case the transmission and reception may be done at different frequencies, which may be at the same and different polarization and/or phase.

Figures 6D, 6E, 6F:
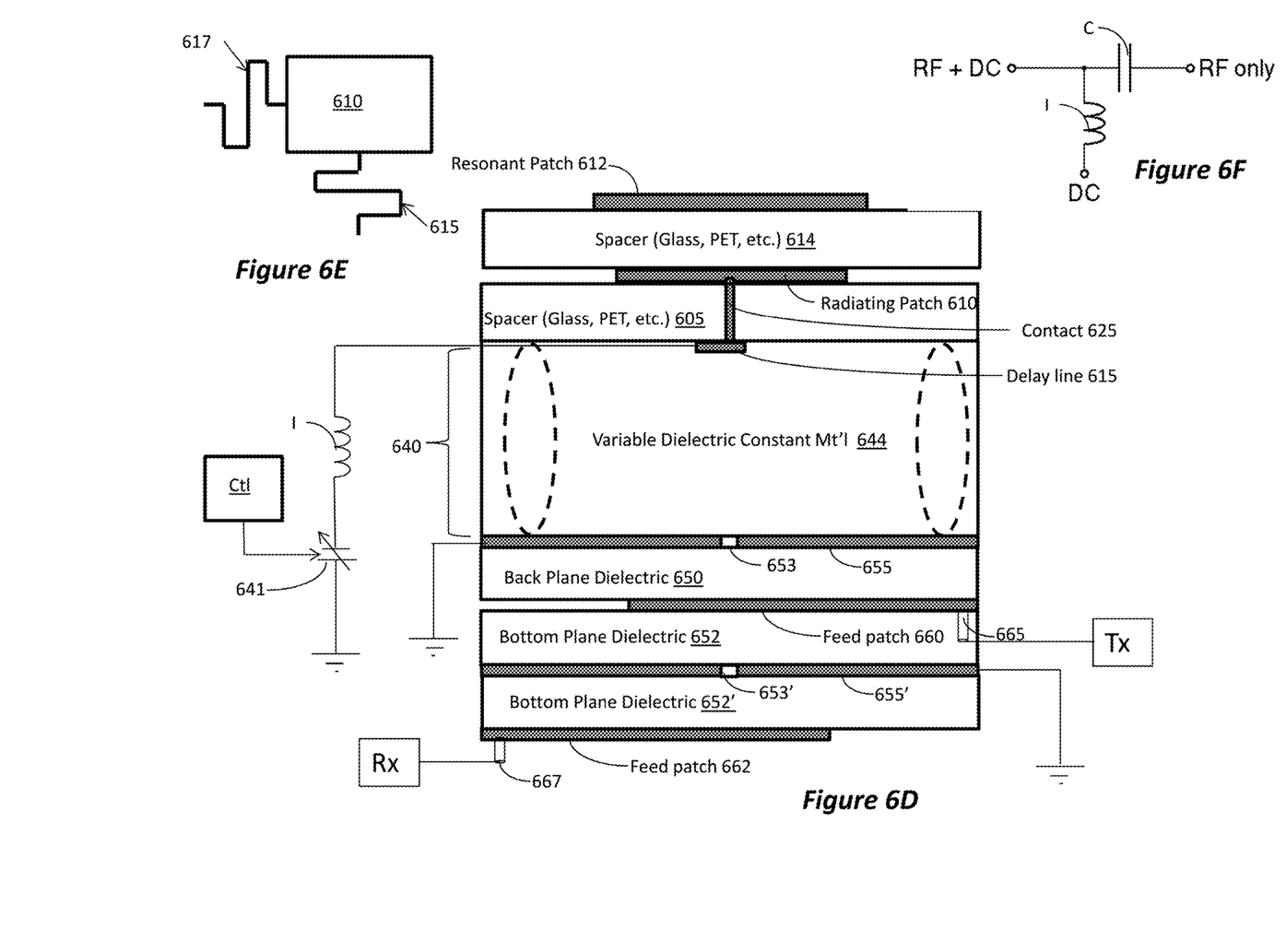

FIG. 6D illustrates another example where one feed patch is used for transmission and the other for reception. However, in FIG. 6D the control of the VDC material is done by feeding the DC potential to the delay line 615. This can be done, e.g., using a modified Bias-T arrangement. Specifically, FIG. 6F illustrates a standard Bias-T circuit. The RF+DC node corresponds to the delay line 615. The DC node corresponds to the output of the variable voltage potential 641. The RF node corresponds to feed patches 660 and 662. As shown in FIG. 6F, the RF node is coupled to the circuit via capacitor C. However, as explained herein, the RF signal in the disclosed embodiments is already coupled to the delay line capacitively, such that capacitor C may be omitted. Thus, by incorporating inductor I into the DC side of the antenna, a modified Bias-T circuitry is created.

Another variation illustrated in FIG. 6D, but which can be implemented in any of the other embodiments, is the elimination of the binder layers. As shown in FIG. 6D, the VDC material is sandwiched between the spacer 605 and the back plane dielectric 650 with the conductive ground 655. In one example, glass beads (shown in broken line) can be interspersed within VDC material 644 so as to maintain the proper separation between the spacer 605 and the back plane dielectric 650 with the conductive ground 655. Of course, glass beads can also be used when using the bider layers.

Figure 7:
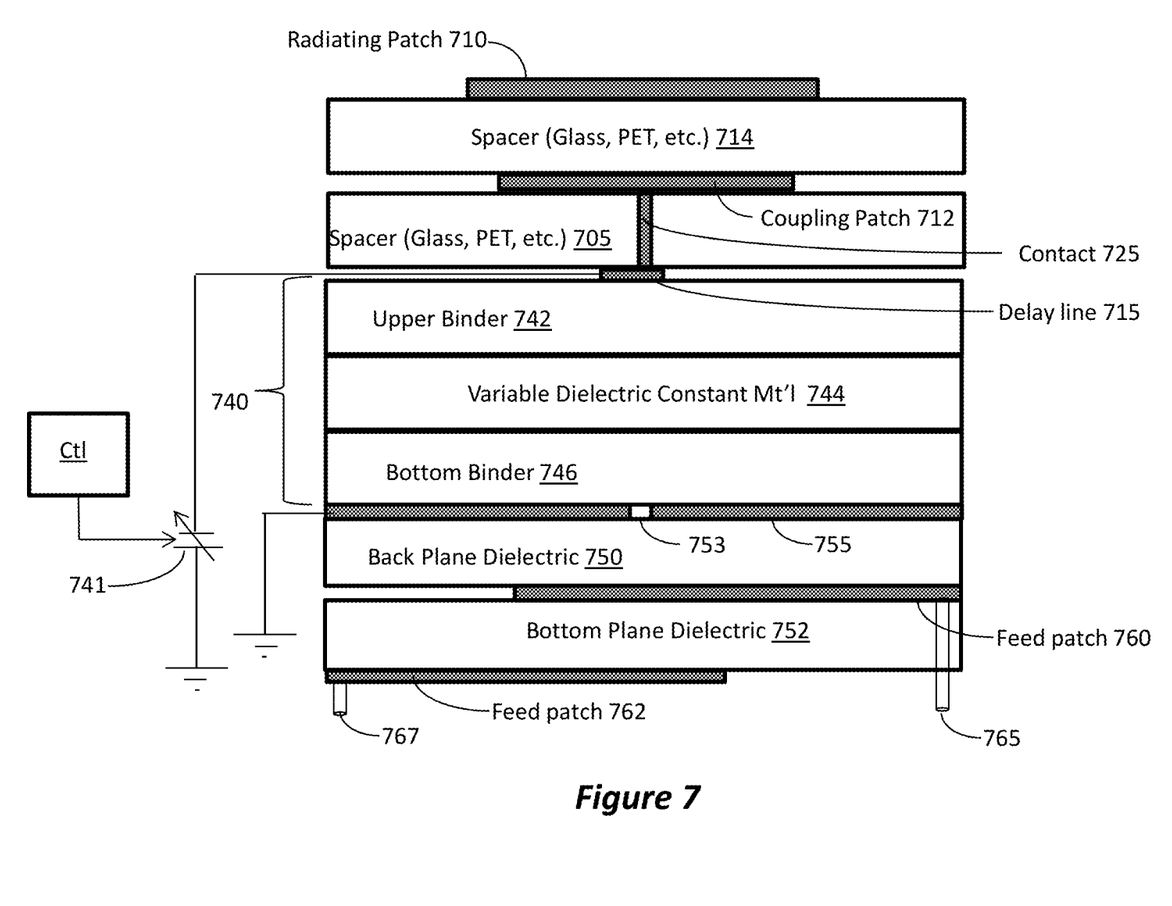
FIG. 7 illustrates an embodiment wherein the DC potential for controlling the variable dielectric constant material is applied to the delay line itself, such that no electrodes are needed.

FIG. 7 illustrates an embodiment wherein the DC potential for controlling the variable dielectric constant material is applied to the delay line itself, such that no electrodes are needed. A bias-t may be used to separate the RF and DC signals. That is, the two electrodes, e.g., electrodes 343 and 347, are omitted. Instead, the output of variable voltage potential supplier 741 is DC connected directly to the delay line 715, establishing a DC potential between delay line 715 and back plane conductive ground 755. Thus, delay line has two functions: it accepts the DC voltage potential to thereby change the dielectric constant of the VDC material 744, and it capacitively couples RF signal to the feed patches 760 and 762.

As can be understood from the disclosure of the embodiments, various antennas may be constructed having the common elements comprising: an insulating spacer; at least one radiating arrangement provided on the insulating spacer, wherein each radiating arrangement comprises a conductive patch provided on the top surface of the insulating spacer, a delay line provided on the bottom surface of the insulating spacer, and a contact made of conductive material and providing electrical DC connection between the conductive patch and the delay line via a window in the insulating spacer; a variable dielectric constant (VDC) plate; a back plane insulator; a back plane conductive ground provided over the top surface of the back plane insulator; and an RF coupling arrangement for each of the at least one radiating arrangement, the RF coupling arrangement comprising a window formed in the back plane conductive ground and a conductive RF feed patch provided over the bottom surface of the back plane insulator in an overlapping orientation to the window. In some embodiments electrodes are provided in order to control the dielectric constant at selected areas of the VDC plate, while in others the delay line is used for this purpose. In some embodiments the conductive patch is used to couple RF signal from the air, while in others it is used to couple RF energy to another, larger, patch which is used to couple RF signal from the air. The size of the patch is configured according to the desired RF wavelength. The RF wavelength can also be used to optimize the RF coupling by properly sizing the window, the delay line, and the feed patch.

Figure 9:
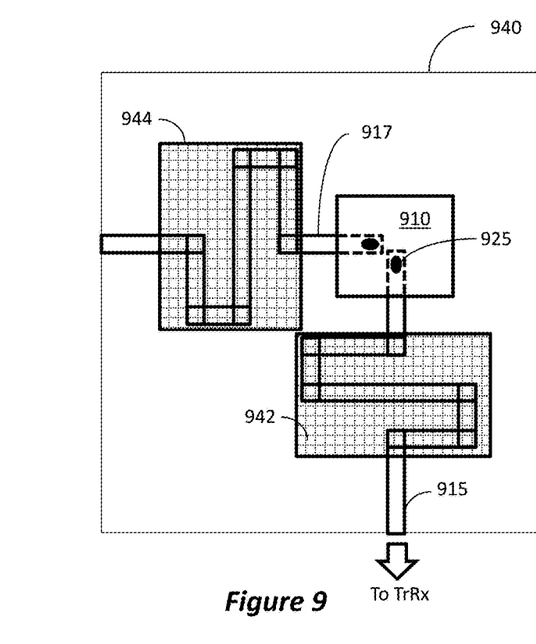
Figure 9A:
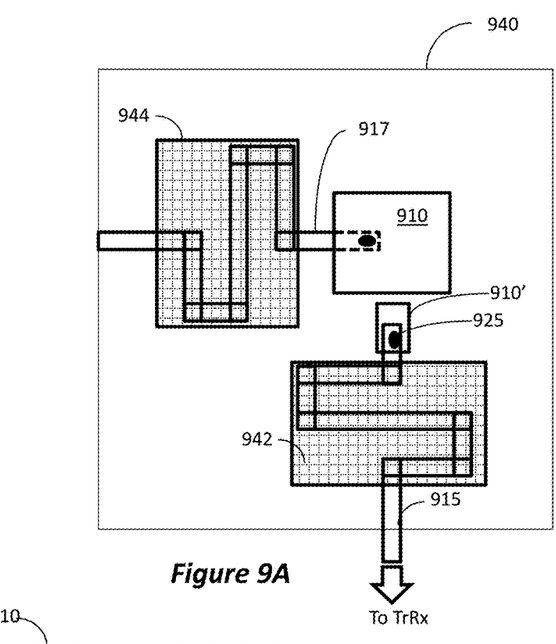
FIG. 9A illustrates a variation of the embodiment shown in FIG. 9.

The VDC plate may be segmented into individual pixels of VDC material. An LCD panel of a flat panel screen may be used for the VDC plate. VDC pixels may be grouped according to the area coverage of the electrodes or the delay lines. In other embodiments the VDC material is provided only in areas controlled by the electrodes or delay line. FIG. 9 illustrates an example wherein the VDC plate 940 includes only defined area of VDC material. VDC area 942 is shown under delay line 915 and VDC area 944 is shown under delay line 917. Each of VDC areas may be one continuous area of VDC material or may be divided into pixels. For ease of production the entire area of VDC plate 940 may include pixels of VDC material. FIG. 9A illustrates capacitive coupling of the delay line 915 to the radiating patch 910 through coupling patch 910', similar to that shown in FIG. 8A, but otherwise it is the same as shown in FIG. 9.

Figure 10:
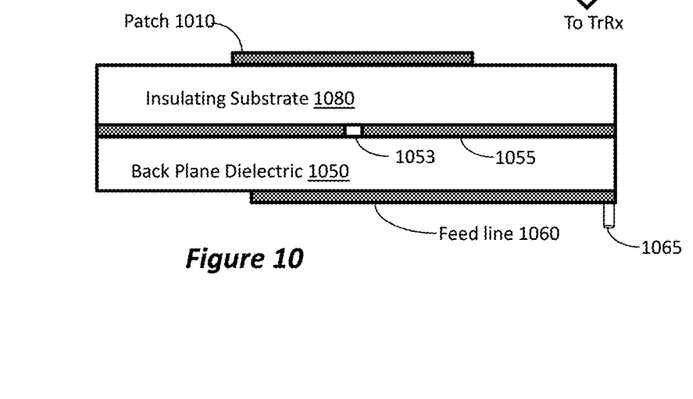
FIG. 10 illustrates an embodiment wherein no VDC plate is used.

Features disclosed herein may be implemented to form an antenna even when no change in phase and/or frequency is needed. FIG. 10 illustrates an embodiment wherein no VDC plate is used. In the embodiment of FIG. 10, the antenna comprises an insulating substrate 1080 and the conductive patch 1010 is provided on the top surface of the insulating substrate 1080. A ground plane 1055 provided on the bottom surface of the insulating substrate 1080, the ground plane comprising an aperture 1053 therein. The aperture is registered to be aligned below the conductive patch 1010. A feed line 1060 has its terminative end thereof registered to be aligned below the aperture 1053, so as to capacitively transmit RF signal to the conductive patch 1010 through the aperture 1053. A back plane dielectric is provided between the ground plane 1055 and the feed line 1060. A connector 1065 is used to transmit/receive RF signal to/from the feed line 1060.

Various embodiments were described above, wherein each embodiment is described with respect to certain features and elements. However, it should be understood that features and elements from one embodiment may be used in conjunction with other features and elements of other embodiments, and the description is intended to cover such possibilities, albeit not all permutations are described explicitly so as to avoid clutter.

Generally, a multi-layer, software controlled antenna is provided. The antenna comprises a radiating patch over an insulator plate. A delay line is provided on the bottom of the insulator plate and has one end thereof RF coupled to the radiating patch. The electrical coupling may be by physical conductive contact or by proximity coupling without physical conductive connection therebetween. A variable dielectric constant (VDC) plate is provided below the delay line. A ground plane is provided on bottom of VDC plate, the ground plane comprising an aperture therein, the aperture being registered to be aligned below the radiating patch. A feed line having terminative end thereof registered to be aligned below the aperture is provided below the ground plane, so as to capacitively transmit RF signal to the conductive patch through the aperture. An electrical isolation is provided between the feed line and the ground plane. For example, a back plane dielectric plate may be provided between the feed line and the ground plane. In some embodiments a second feed line is provided, which may coupled RF signal to the delay line through another aperture provided in the ground plane, or through a second, separate ground plane.

To obtain an enhanced bandwidth, a resonant patch may be provided over the radiating patch, wherein in some embodiments an insulating spacer may be provided between the radiating patch and the resonant patch. In some embodiments electrodes are provided in the VDC plate. The electrodes are coupled to variable voltage potential source, which may be connected to a controller. In other embodiments the VDC plate is controlled by applying DC potential to the delay line. Applying a DC potential to the delay line may be implemented using a modified Biat-T, wherein the feed line, ground plate, VDC plate, and delay line form the RF leg of the Bias-T circuitry. The DC leg may be coupled to the delay line through an intermediate inductor (see FIG. 6D).

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. An antenna comprising:
an insulating substrate;
a plurality of conductive patches provided on top surface of the insulating substrate;
a plurality of delay lines provided below the insulating substrate, and each coupling RF signal to a corresponding patch of the plurality of conductive patches;
a ground plane provided below the plurality of delay lines, the ground plane comprising a plurality of apertures therein;
a plurality of feed lines, each having terminus end thereof registered to be aligned below one of the plurality of apertures, so as to capacitively couple RF signal to a corresponding delay line of the plurality of delay lines.

2. The antenna of claim 1, further comprising a plurality of vias, each making electrical contact to one of the conductive patches and one of the delay lines.

3. The antenna of claim 1, further comprising a variable dielectric constant (VDC) layer provided between the delay lines and the ground plane.

4. The antenna of claim 3, wherein the variable dielectric constant layer comprises liquid crystal.

5. The antenna of claim 3, further comprising a plurality of conductive lines for controlling the variable dielectric constant material.

6. The antenna of claim 1, wherein each of the apertures has length L of about half of wavelength of RF signal traveling in the feed lines.

7. The antenna of claim 6, wherein each of the apertures has a width W of about one-tenth of wavelength of RF signal traveling in the feed lines.

8. The antenna of claim 7, wherein terminus end of each of the feed lines extends beyond the corresponding aperture a distance D of about half of wavelength of RF signal traveling in the feed lines.

9. The antenna of claim 7, wherein a terminus end of each of the delay lines extends beyond the corresponding aperture a distance E of about half of wavelength of RF signal traveling in the delay lines.

10. The antenna of claim 5, wherein each of the conductive lines is electrically connected to a corresponding delay line.

11. The antenna of claim 1, further comprising a dielectric cover provided over the conductive patch, and a plurality of radiating patches provided on top of the dielectric cover, each in alignment with one of the conductive patches.

12. The antenna of claim 1, wherein each of the delay lines comprises a meandering conductive line.

13. The antenna of claim 1, wherein a number of the plurality of delay lines is double number of conductive patches, and wherein a pair of conductive patches is connected to each corresponding conductive patch, oriented orthogonally to each other.

14. The antenna of claim 13, wherein each of the conductive patches is square.

15. An antenna comprising:
an top dielectric;
a bottom dielectric;
a variable dielectric constant (VDC) plate positioned between the top dielectric and bottom dielectric;
a conductive ground having a plurality of apertures; and,
a plurality of radiating arrangements, wherein each of the radiating arrangements comprises:
a conductive patch provided on the top dielectric;
at least one control line;
at least one delay line configured to couple RF radiation to a respective conductive patch, one end of the delay line traversing a respective aperture;
a feeding line having one end traversing a respective aperture, wherein RF energy is capacitively coupled between one delay line and one feeding line via the respective aperture.

16. The antenna of claim 15, further comprising a plurality of bias-T arrangements, each coupled to one of the control lines.

17. The antenna of claim 15, wherein the bottom dielectric comprises a Rogers or PTFE material.

18. The antenna of claim 15, wherein each of the apertures has length L of about half of wavelength of RF signal traveling in the feed lines and has a width W of about one-tenth of wavelength of RF signal traveling in the feed lines.

19. The antenna of claim 15, wherein terminus end of each of the feed lines extends beyond the corresponding aperture a distance D of about half of wavelength of RF signal traveling in the feed lines.

20. The antenna of claim 15, comprising a second RF feed patch oriented orthogonally to the RF feed patch and in an overlapping orientation to a second window formed in the conductive ground.

* * * * *